(12) United States Patent
Sterk et al.

(10) Patent No.: US 10,317,251 B2
(45) Date of Patent: Jun. 11, 2019

(54) DEVICE FOR CONTACTLESS ACTUATION OF A VEHICLE DOOR, AND VEHICLE

(71) Applicant: BROSE FAHRZEUGTEILE GMBH & CO. KOMMANDITGESELLSCHAFT, HALLSTADT, Hallstadt (DE)

(72) Inventors: Felix Sterk, Schlier (DE); Udo Geuther, Bamberg (DE)

(73) Assignee: Brose Fahrzeugteile GmbH & Co. Kommanditgesellschaft, Hallstadt, Hallstadt (DE)

( * ) Notice: Subject to any disclaimer, the term of this patent is extended or adjusted under 35 U.S.C. 154(b) by 465 days.

(21) Appl. No.: 15/050,668

(22) Filed: Feb. 23, 2016

(65) Prior Publication Data

US 2016/0169708 A1 Jun. 16, 2016

Related U.S. Application Data

(63) Continuation of application No. PCT/EP2014/067334, filed on Aug. 13, 2014.

(30) Foreign Application Priority Data

Aug. 23, 2013 (DE) .................. 10 2013 014 142

(51) Int. Cl.
*B60Q 1/34* (2006.01)
*G01D 5/24* (2006.01)
(Continued)

(52) U.S. Cl.
CPC ............ *G01D 5/24* (2013.01); *B60R 25/2054* (2013.01); *E05F 15/73* (2015.01); *H02P 1/00* (2013.01);
(Continued)

(58) Field of Classification Search
CPC .......... G01R 15/16; G01R 27/26; G01R 1/30; G01R 31/028; G01R 19/0084;
(Continued)

(56) References Cited

U.S. PATENT DOCUMENTS 6,828,801 B1 * 12/2004 Burdick ............... G01D 5/2417
324/658
7,545,153 B2 * 6/2009 Abe ..................... H03K 17/955
324/658

(Continued)

FOREIGN PATENT DOCUMENTS

CN 101010477 A 8/2007
CN 102246417 A 11/2011
(Continued)

*Primary Examiner* — Jermele M Hollington
*Assistant Examiner* — Taqi Nasir
(74) *Attorney, Agent, or Firm* — Laurence A. Greenberg; Werner H. Stemer; Ralph E. Locher

(57) ABSTRACT

A device for actuating a door of a vehicle in a contact-free manner includes a capacitive proximity sensor. The proximity sensor has at least one sensor electrode for emitting an electric detection field in a detection area in front of the sensor electrode. An insulated electric conductor is arranged in front of the sensor electrode for shaping the detection field.

10 Claims, 2 Drawing Sheets

(51) Int. Cl.
*H03K 17/955* (2006.01)
*E05F 15/73* (2015.01)
*B60R 25/20* (2013.01)
*H02P 1/00* (2006.01)
*H03K 17/96* (2006.01)

(52) U.S. Cl.
CPC ...... *H03K 17/955* (2013.01); *E05Y 2400/852* (2013.01); *E05Y 2400/858* (2013.01); *E05Y 2900/531* (2013.01); *H03K 2017/9613* (2013.01); *H03K 2217/96077* (2013.01); *H03K 2217/96078* (2013.01)

(58) Field of Classification Search
CPC .... G01R 15/06; G01R 19/0092; B60Q 1/447; B60Q 9/008; B60Q 1/525; B60Q 9/00; B60Q 1/34; B60Q 1/52; B60Q 1/346; B60Q 1/38
USPC .......... 324/750.17, 754.28, 658, 686, 76.66; 340/426.24, 426.28, 539.22, 539.23, 340/686.1, 686.6, 465, 468, 475, 479, 340/903, 435, 436, 472; 701/49
See application file for complete search history.

(56) References Cited

U.S. PATENT DOCUMENTS

| | | | | |
|---|---|---|---|---|
| 7,633,301 | B2 * | 12/2009 | Steenwyk | B60N 2/002 |
| | | | | 324/457 |
| 8,228,166 | B2 | 7/2012 | Eberhard | |
| 8,299,807 | B2 * | 10/2012 | Sakamaki | B61D 19/026 |
| | | | | 324/658 |
| 8,593,161 | B2 * | 11/2013 | Kato | B60J 1/17 |
| | | | | 324/326 |
| 8,688,325 | B2 * | 4/2014 | Wolf | B60R 25/2045 |
| | | | | 348/154 |
| 8,878,550 | B2 | 11/2014 | Auybry et al. | |
| 9,081,032 | B2 | 7/2015 | Lange | |
| 9,205,727 | B2 * | 12/2015 | Herthan | B60R 25/2045 |
| 9,243,439 | B2 * | 1/2016 | Adams | E05F 15/73 |
| 9,243,441 | B2 * | 1/2016 | Gupta | E05F 15/77 |
| 9,283,905 | B2 * | 3/2016 | Herthan | B60R 25/2045 |
| 9,587,417 | B2 | 3/2017 | Van Gastel | |
| 9,707,929 | B2 | 7/2017 | Holzberg et al. | |
| 2003/0122556 | A1 * | 7/2003 | Sueyoshi | B60R 25/246 |
| | | | | 324/686 |
| 2011/0182458 | A1 | 7/2011 | Rosener et al. | |
| 2011/0273188 | A1 | 11/2011 | Aubry et al. | |
| 2011/0276234 | A1 * | 11/2011 | Van Gastel | E05B 81/78 |
| | | | | 701/49 |
| 2013/0234848 | A1 | 9/2013 | Holzberg et al. | |

FOREIGN PATENT DOCUMENTS

| | | | | |
|---|---|---|---|---|
| CN | 102271975 A | 12/2011 | | |
| CN | 103153717 A | 6/2013 | | |
| CN | 103168317 A | 6/2013 | | |
| DE | 102008063366 A1 | 1/2010 | | |
| DE | 102010049400 A1 | 4/2012 | | |
| FR | 2933825 A1 * | 1/2010 | ........... | H03K 17/955 |
| WO | 2010043936 A1 | 4/2010 | | |

* cited by examiner

DEVICE FOR CONTACTLESS ACTUATION OF A VEHICLE DOOR, AND VEHICLE

CROSS-REFERENCE TO RELATED APPLICATION

This application is a continuation, under 35 U.S.C. § 120, of copending international application No. PCT/EP2014/067334, filed Aug. 13, 2014, which designated the United States; this application also claims the priority, under 35 U.S.C. § 119, of German patent application No. DE 10 2013 014 142.7, filed Aug. 23, 2013; the prior applications are herewith incorporated by reference in their entirety.

BACKGROUND OF THE INVENTION

Field of the Invention

The invention relates to a device for actuating, i.e. for opening and/or closing a vehicle door in a contact-free manner. The device has a capacitive proximity sensor with at least one sensor electrode for emitting an electrical detection field into a detection space in front of the sensor electrode. The term "vehicle door" denotes here and below generally any elements with which the outer skin of a vehicle can be opened and closed, in particular also a tailgate, a trunk lid, a sunroof or a fuel tank cover.

For a user of a vehicle it is sometimes desirable to open or close a vehicle door, in particular the tailgate of a trunk, in a contact-free manner. This is the case, for example, when the user is using both hands to carry an object such as, for example, a beer crate, which is to be placed in the trunk of the vehicle.

A device of the generic type for actuating a tailgate in a contact-free manner is known, for example, from German published patent application DE 10 2008 063 366 A1 and U.S. published patent application US 20110276234 A1. The known device has two capacitive proximity sensors and therefore, in particular, two sensor electrodes. The sensor electrodes are arranged here in a rear region or in a lower region of the rear bumper of a vehicle and detect a movement of the user's foot as a door opening request, in response to which the device causes the tailgate to open. The device is configured to open the tailgate if the user places/stretches his foot under the bumper.

A sensor unit of this type should preferably be able to make a reliable differentiation between a specific characteristic foot movement with which the door opening request is to be indicated and other foot movements. For example, the sensor unit is to cause the trunk to open if the vehicle user carries out a kicking movement in the longitudinal direction of the vehicle under the bumper, while opening of the trunk is intended to fail to occur if the vehicle user moves his foot in the vicinity of the sensor electrodes in some other way (and with a different intention).

It has been found empirically that a precise differentiation between the foot movement which is characteristic of the door opening request and other movements is, however, possible with sufficient reliability only if the detection fields which are respectively emitted by the two sensor electrodes are sufficiently separate. For this purpose, the sensor electrodes must, in the absence of measures to form the detection fields, be arranged at a sufficiently large distance from one another, of typically at least 5 cm. This is not possible in all vehicles for reasons of installation space.

In order to form the detection fields better, screening electrodes which are set to ground potential are now used, as a result of the case of the device disclosed in DE 10 2008 063 366 A1 (US 20110276234 A1), which screening electrodes surround the sensor electrodes at the rear (on the vehicle side) and therefore screen them electrically from the bodywork of the vehicle. Such screening electrodes, however, disadvantageously reduce the sensitivity of the proximity sensors since they generate a considerable offset capacitance which is independent of movement and which is generally significantly larger than the actual measuring signal. In addition, such screening electrodes and their grounding entail a considerable amount of additional expenditure in terms of circuitry.

SUMMARY OF THE INVENTION

It is accordingly an object of the invention to provide a device for actuating a vehicle door in a contact-free manner which overcomes the above-mentioned and other disadvantages of the heretofore-known devices and methods of this general type and which is as simple as possible and is improved in terms of its susceptibility to faults.

With the foregoing and other objects in view there is provided, in accordance with the invention, a device for actuating a vehicle door of a vehicle in a contact-free manner, the device comprising:

a capacitive proximity sensor having at least one sensor electrode for emitting an electrical detection field into a detection space located in front of the sensor electrode; and an insulated electrical conductor for forming the detection field disposed in front of the sensor electrode.

With the above and other objects in view there is also provided, in accordance with the invention, a vehicle having a vehicle door and a device for actuating the vehicle door in a contact-free manner. As above, the device comprises a capacitive proximity sensor with at least one sensor electrode for emitting an electrical detection field into a detection space located in front of the sensor electrode, and an insulated electrical conductor arranged in front of the sensor electrode for shaping the electrical detection field.

According to the above, a device for actuating a vehicle door of a vehicle in a contact-free manner is specified, which device comprises a capacitive proximity sensor with at least one sensor electrode for emitting an electrical detection field in a detection space which is located in front of the sensor electrode. According to the invention, an insulated electrical conductor for forming the detection field is arranged in front of the sensor electrode. According to the invention, an insulated electrical conductor for forming the detection field is arranged in front of the sensor electrode. In this context, an "insulated" electrical conductor is understood to be a body made of an electrically conductive material which is not connected electrically to any other object, with the result that in particular an electrical charge cannot be applied to this conductor. Consequently, it is also not possible to apply a specific electrical potential—independent of external electrical fields—to the insulated conductor. The conductor which according to the invention is arranged in front of the sensor electrode as a result is distinguished from an electrode, in particular from a grounded screening electrode.

The effect of the insulated conductor which is used with the invention is known to consist in the fact that the insulated conductor forms an equi-potential surface in the electrical detection field of the sensor electrode. As a result of shifting of the charge in the interior of the conductor, the field lines of the detection field are shaped in the surroundings of the conductor in such a way that the field lines impinge perpendicularly on the surface of the conductor everywhere.

This effect is advantageously used to shape and orient the detection field, thereby permitting a high degree of fail safety of the device.

In contrast to a screening electrode, the conductor firstly does not cause any attenuation of the detection field in the spatial area facing away from the sensor electrode. Instead, as a result of concentration and homogenization of the electrical field in its surroundings the conductor even generally brings about local amplification of the field. Secondly, in contrast to a screening electrode, the insulated conductor which is arranged in the detection field in turn influences the measurable capacitance of the sensor electrode slightly at most and therefore does not adversely affect the sensitivity of the proximity sensor either.

Finally, owing to the use of the insulated conductor, the device according to the invention can also be implemented particularly easily, especially since it permits a comparatively high level of flexibility with respect to the arrangement of the sensor electrodes and also the expenditure in terms of circuitry which is usually entailed with screening electrodes is dispensed with.

In one preferred refinement of the invention, the conductor is formed by a planar foil or an (electrically conductive) coating which is applied to a vehicle part (even an electrically insulating one) which is located in front of the sensor electrode or is introduced into such a vehicle part. When the conductor is embodied as a film, it is preferably bonded or laminated onto the vehicle part or embedded in the material of the vehicle part. A conductor in the form of a coating can be manufactured, for example, by vapor depositing, sputtering, spraying or coating. As an alternative to the embodiments mentioned above, the conductor can, however, within the scope of the invention also be formed by a solid metal part, a mesh or fabric made of wire or an electrically conductive plastic layer.

The use of the conductor in a sensor electrode which, owing to its geometry, does not itself emit the detection field in a pronounced predominant direction is particularly advantageous. The sensor electrode is therefore preferably formed by a round conductor (circular or oval in cross section) which would emit the detection field without the field-forming effect of the insulated conductor in an at least approximately radially symmetrical—and therefore less directional—form.

In one preferred application, the vehicle door which is to be actuated is a tailgate. The insulated conductor is expediently applied to a rear bumper trim of the vehicle—in particular on the outside—or is introduced into the rear bumper trim here.

In order to differentiate precisely between a foot movement which signals a door opening request and other movements in the surroundings of the tailgate, the device expediently comprises two sensor electrodes which are mounted at a given distance one above the other behind the bumper trim and serve to emit an upper detection field or a lower detection field into a respectively assigned detection space. The insulated conductor is assigned, in particular, to the upper sensor electrode here. In order to spatially separate the two detection fields, this conductor is arranged—in the correct installation situation on the vehicle—at least approximately at the same height as the upper sensor electrode or higher than the latter. Within the scope of the invention, a further insulated conductor can be assigned to the lower sensor electrode in order to separate the detection fields even better. In addition, an improved orientation of the respective detection field is also possible by means of the conductor or conductors.

Other features which are considered as characteristic for the invention are set forth in the appended claims.

Although the invention is illustrated and described herein as embodied in a device for actuating a vehicle door in a contact-free manner, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
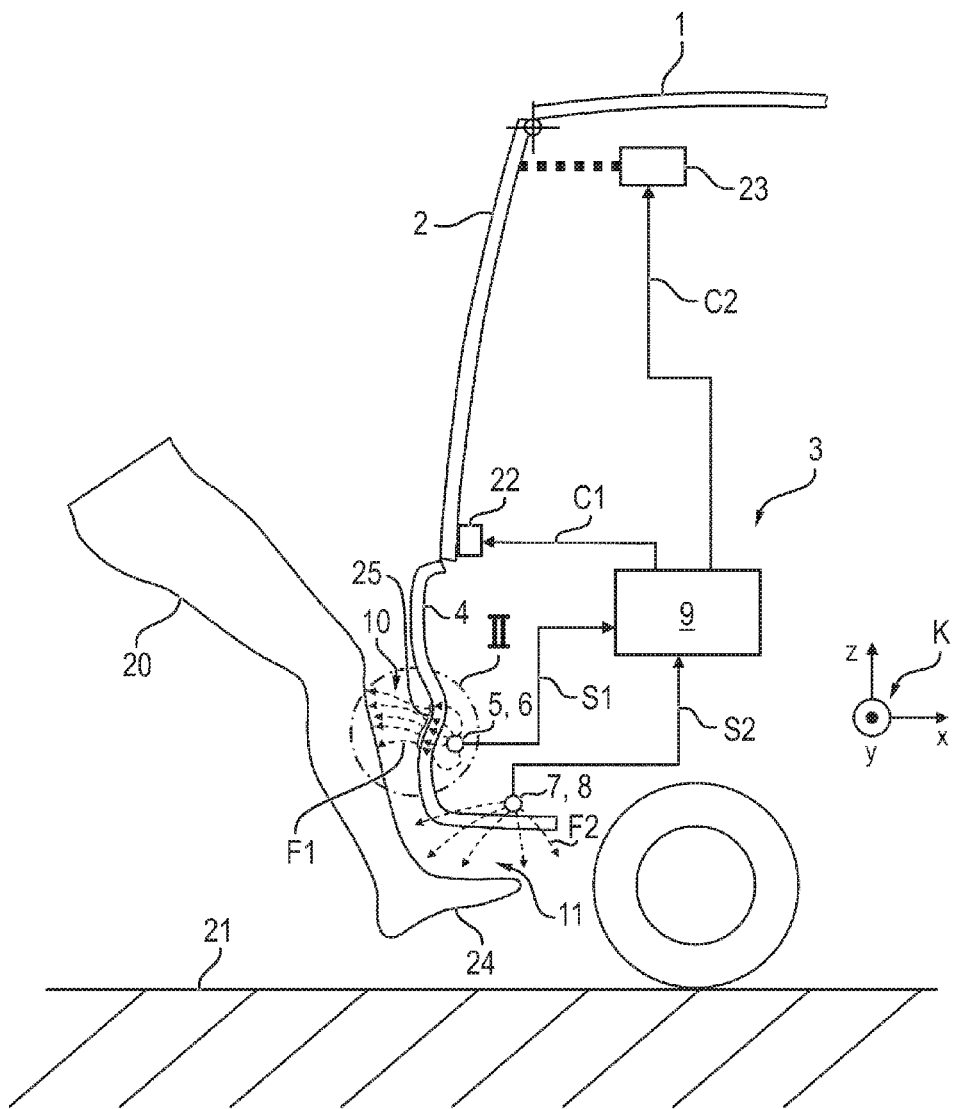
FIG. 1 shows a highly schematic side view of a rear part of a motor vehicle, with a tailgate and a device for actuating the latter in a contact-free manner.

Referring now to the figures of the drawing in detail and first, particularly, to FIG. 1 thereof, there is shown a rear-side (rear) section of a motor vehicle 1 with a tailgate 2 and with a device 3 for actuating said tailgate 2 in a contact-free manner. The motor vehicle 1 also comprises a rear-side bumper with a bumper trim 4 made of plastic.

With respect to the vehicle 1, a Cartesian vehicle coordinate system K is defined. In this vehicle coordinate system K, the vehicle longitudinal axis which points in the direction of travel is denoted by x, the horizontal transverse vehicle axis which is perpendicular thereto is denoted by y (perpendicular to the plane of the drawing in FIG. 1), and the vertical axis which points vertically upward is denoted by z.

The device 3 comprises a first capacitive proximity sensor 5 with a sensor electrode 6 and a second capacitive proximity sensor 7 with a sensor electrode 8. The two sensor electrodes 6 and 8 are embodied as round conductors, for example in each case as electrical conductors in the form of wires or cylindrical jackets. The two proximity sensors 5 and 7 can be embodied as structural units which are independent of one another. However, in one preferred embodiment the two proximity sensors 5 and 7 share a common (not explicitly illustrated) capacitance measuring circuit to which the two sensor electrodes 6 and 8 are connected.

The device 3 also comprises a control unit 9 which is formed primarily by a microcontroller with control software which is implemented therein.

The two sensor electrodes 6, 8 are mounted on an inner side of the bumper trim 4. The sensor electrodes 6 and 8 are mounted here in a rear region or a lower region of the bumper trim 4.

The sensor electrode 6 is as a result arranged at a higher point than the sensor electrode 8, for which reason the sensor electrode 6 is also referred to as the "upper sensor electrode" and the sensor electrode 8 is also referred to as the "lower sensor electrode." The distance formed between the sensor electrodes 6, 8 is, in particular, less than 5 cm.

During operation, an electrical measuring signal in the form of an electrical alternating voltage is applied to each of the sensor electrodes 6 and 8. Under the effect of this measuring signal, an (upper) electrical detection field F1, indicated schematically in FIGS. 1 and 2 by field lines, is formed in a spatial volume which is located in front of the upper sensor electrode 6 and is referred to below as "upper" detection space 10. Likewise, under the effect of the electrical measuring signal, a lower electrical detection field F2, also indicated schematically in FIG. 1 by field lines, propagates in a spatial volume (referred to below as lower detection space 11) which is located in front of the sensor electrode 8.

A human body part—for example a leg 20 of a vehicle user according to FIG. 1—which is introduced into the respective detection space 10, 11, acts as a counter electrode for the respective sensor electrode 6, 8 owing to the electrical conductivity of the human body tissue and the grounding of the human body tissue with the underlying surface 21. Each of the sensor electrodes 6 and 8 therefore forms with the leg 20 an (electrical) capacitor whose capacitance changes in a characteristic way with the distance of the leg 20 from the respective sensor electrode 6, 8.

In order to detect a door opening request of the vehicle user, the control unit 9 detects signals S1 and S2 of the proximity sensors 5 and 7 which contain information about the capacitance detected by the respective proximity sensor 5, 7 and therefore information about the presence of a body part in the respective detection space 10 or 11. The signals S1 and S2 are evaluated by the control unit 9 in accordance with stored criteria to the effect of determining whether a specific movement of the vehicle user's leg, defined for the signaling of a door opening request, can be detected. Under certain circumstances, the control unit 9 actuates, by means of actuation signals C1 and C2, a door lock 22 which is assigned to the tailgate 2 or an electric servomotor 23 of a tailgate actuating device, with the result that the tailgate 2 is opened automatically by the servomotor 23. For example, a kicking movement, during which the vehicle user places his foot 24 briefly under the bumper trim 4 in the manner illustrated in FIG. 1, and subsequently pulls it back, is defined as a characteristic body movement for signaling a door opening request. This leg movement is expressed in a characteristic way in a pulse-like synchronous signal profile of the two measuring signals S1 and S2, which signal profile is detected by the control unit 9 by comparative evaluation of the two measuring signals S1 and S2 as an indication of the door opening request.

Figure 2:
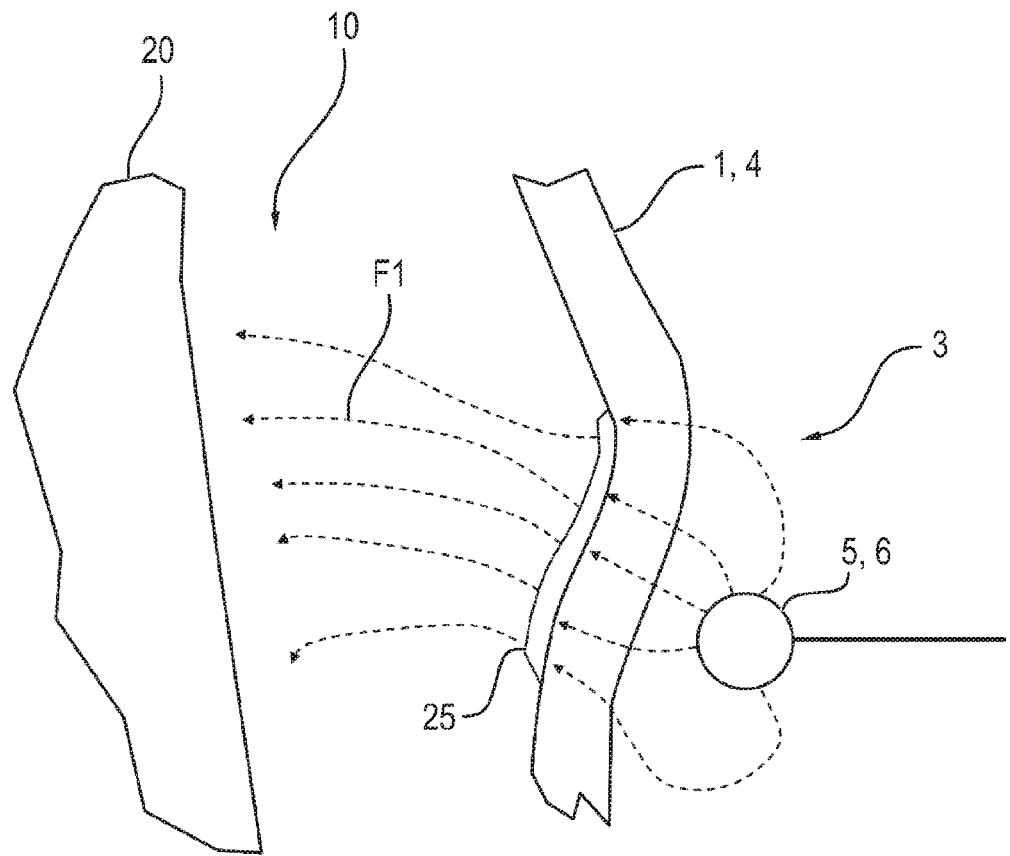
FIG. 2 is an enlarged view of a detail II from FIG. 1.

A sufficient, reliable differentiation of the kicking movement defined for the door opening request from other leg movements which the vehicle user carries out with a different intention, is, however, possible by means of the signal analysis performed by the control unit 9 only if the detection fields F1 and F2 are sufficiently spatially separated from one another. This separation of the detection fields F1 and F2 is assisted within the scope of the device 3 by means of an insulated electrical conductor 25 (which is therefore completely electrically isolated from the surroundings) which is located in front of the sensor electrode 6 in the direction of the assigned detection space 10. The conductor 25 which is illustrated only in a rough schematic fashion in FIGS. 1 and 2 is preferably formed by a metal foil which is bonded on the outside to the bumper trim 4. In an alternative refinement, the conductor 25 is formed by a metallic coating which is applied to the bumper trim 4 by vapor depositing or spraying. As is indicated in a rough schematic fashion in the figures, the conductor 25 brings about a deformation of the profile of the electrical field F1, which would be emitted by the sensor electrode 6 in an at least approximately radially symmetrical form in the absence of the conductor 25. As is apparent from FIGS. 1 and 2, the conductor 25 is arranged at a slightly higher point (in the direction of the vertical axis z) than the sensor electrode 6, and therefore deflects its detection field F1 upward.

The invention becomes particularly clear from the example described above, but it is nevertheless not restricted to this exemplary embodiment. Instead, numerous further embodiments of the invention can be derived from the above description and the claims below.

The following is a summary list of reference numerals and the corresponding structure used in the above description of the invention:

1 Motor vehicle
2 Tailgate
3 Device
4 Bumper trim
5 Proximity sensor
6 Sensor electrode
7 Proximity sensor
8 Sensor electrode
9 Control unit
10 (upper) Detection space
11 (lower) Detection space
20 Leg
21 Underlying surface
22 Door lock
23 Servomotor
24 Foot
25 Conductor
K Vehicle coordinate system
x Vehicle longitudinal axis
y Vehicle transverse axis
z Vertical axis
F1 (upper) Detection field
F2 (lower) Detection field
S1 Signal
S2 Signal
C1 Actuation signal
C2 Actuation signal

The invention claimed is:

1. A device for actuating a vehicle door of a vehicle in a contact-free manner, the device comprising:
a capacitive proximity sensor having at least one sensor electrode which, upon being energized by an electrical alternating voltage, emits an electrical detection field into a detection space located in front of said sensor electrode; and
an insulated electrical conductor for shaping the detection field disposed in front of said sensor electrode;
said sensor electrode and said insulated electrical conductor together forming the detection field in front of said insulated electrical conductor for detecting a presence of an object in the detection field at a spacing distance from said insulated electrical conductor.

2. The device according to claim 1, wherein said insulated electrical conductor is a planar foil or coating applied to a vehicle part located in front of said sensor electrode or introduced into the vehicle part.

3. The device according to claim 1, wherein said sensor electrode is a round conductor.

4. The device according to claim 2, wherein the vehicle door to be actuated is a tailgate, and wherein said insulated electrical conductor is applied to a rear bumper trim of the vehicle or is introduced into the rear bumper trim.

5. The device according to claim 4, wherein:
said sensor electrode is one of two sensor electrodes mounted at a given distance one above the other behind the bumper trim and configured to emit an upper detection field and a lower detection field, respectively, into a respectively assigned detection space; and said insulated electrical conductor is assigned to said upper sensor electrode and, in order to spatially separate said upper and lower detection fields, is arranged at least approximately at a same level height as, or higher than, said upper sensor electrode.

6. A vehicle having a vehicle door and a device for actuating the vehicle door in a contact-free manner, the device comprising:

a capacitive proximity sensor having at least one sensor electrode which, upon being energized by an electrical alternating voltage, emits an electrical detection field into a detection space located in front of said sensor electrode; and an insulated electrical conductor arranged in front of said sensor electrode for shaping the electrical detection field;

said sensor electrode and said insulated electrical conductor together forming the detection field in front of said insulated electrical conductor for detecting a presence of an object in the detection field at a spacing distance from said insulated electrical conductor.

7. The vehicle according to claim 6, wherein said insulated electrical conductor is a planar foil or coating applied to a vehicle part of the vehicle located in front of said sensor electrode or introduced into the vehicle part.

8. The vehicle according to claim 6, wherein said sensor electrode is a round conductor.

9. The vehicle according to claim 7, wherein the vehicle door to be actuated is a tailgate, and wherein said insulated electrical conductor is applied to a rear bumper trim of the vehicle or is introduced into the rear bumper trim.

10. The device according to claim 9, wherein:

said sensor electrode is one of two sensor electrodes mounted at a given distance one above the other behind the bumper trim and configured to emit an upper detection field and a lower detection field, respectively, into a respectively assigned detection space; and said insulated electrical conductor is assigned to said upper sensor electrode and, in order to spatially separate said upper and lower detection fields, is arranged at least approximately at a same level height as, or higher than, said upper sensor electrode.

* * * * *